United States Patent [19]

Chi Yu

[11] Patent Number: 4,527,228
[45] Date of Patent: Jul. 2, 1985

[54] WIDE BAND FULL DUTY CYCLE ISOLATED TRANSFORMER DRIVER

[76] Inventor: Simon S. Chi Yu, 4090 Whittle Ave., Oakland, Calif. 94602

[21] Appl. No.: 533,752

[22] Filed: Sep. 19, 1983

[51] Int. Cl.³ .............................................. H02P 13/20
[52] U.S. Cl. ......................................... 363/98; 363/41
[58] Field of Search ....................... 363/21, 26, 41, 97, 363/98, 133, 134; 307/270

[56] References Cited

U.S. PATENT DOCUMENTS

4,314,325 2/1982 Siebert ................................... 363/41

Primary Examiner—Peter S. Wong
Assistant Examiner—Judson H. Jones
Attorney, Agent, or Firm—Bielen and Peterson

[57] ABSTRACT

A driver stage utilizing a zero-crossing detector. The input to the zero-crossing detector consists of a signal which originates from means for generating a pulse width modulated signal. The pulse width modulated signal transformed and rectified before transmission to the zero-crossing detector. A solid state switch is placed across a voltage source and is operated by the output of the zero-crossing detector. The driver may be combined with a similar driver to serve as an inverter.

13 Claims, 14 Drawing Figures

FIG._5. DRIVER 0-50% PWM MOSFET

FIG._6. HIGH CURRENT DARLINGTON DRIVER

WIDE BAND FULL DUTY CYCLE ISOLATED TRANSFORMER DRIVER

BACKGROUND OF THE INVENTION

The present invention relates to a novel and useful driver stage which is specially useful as a component of an inverter.

Sophisticated equipment such as a computer requires a very reliable source of AC power. The requirement may vary from zero to 400 HZ. It has been found that commercially available power contains transient spikes having an amplitude of almost 1000 volts. This, of course, is not acceptable by certain equipment. In addition emergency power must be supplied to this equipment from a battery and to produce this requires an AC source.

There are devices which exist that perform this inverter function. Ferroresonant transformers are subject to audio noise and are quite heavy. Multi step wave type inverters require heavy iron cores and are not easily applicable to a small computer system. Large capacitors are often required for filtering which adds to bulk of this device.

Reference is made to the U.S. Pat. No. 4,186,437 to Cuk which describes a push-pull switching power amplifier. The Cuk amplifier employs P-N-P transistors which are expensive and not readily available commercially.

An inverter which is operable at 100% modulation and is light and portable would be a great advance in the art of supplying power.

SUMMARY OF THE INVENTION

In accordance with the present invention a novel and useful driver stage which is specially useful as a component of a power is provided.

The driver stage of the present invention utilizes means for detecting a low point in a signal such as a zero-crossing detector. Means is provided for generating a pulse width modulated signal having a series of peaks and valleys or lows at a first voltage. Means is also provided for transforming the pulse width modulated signal to a second voltage. Preferably the voltage is stepped down rather than stepped up at this point in the drivers circuity.

The transformed signal is rectified and fed to the zero-crossing detector as an input thereto.

A solid state switch, such as a transistor switch, is placed across a voltage source. A diode connects to the solid stage switch and receives the transformed signal as its input. Thus, the diode turns on the solid state switch during the peaks of the transformed signal.

Means is also provided for delivering the turn-off signal to the solid state switch. Such means is determined by the output of the zero crossing detector in relation to the valleys of the transformed rectified signal delivered to the zero-crossing detector.

The means for delivering a turn-off signal to the solid state switch may include a clamp transistor, the base of which is connected to the output of the zero-crossing detector. The emitter of the clamp transistor is connected to ground while the collector is connected to means for providing a negative voltage to solid state switch. The zero-crossing detector would activate the clamp transistor and trigger the means for providing a negative voltage to the solid state switch. Such means may include connecting the output of the diode and positive side of a speed up capacitor to the collector of the clamp transistor. The negative side of the speed up capacitor would be fed to the solid state switch. In addition, the zener diode, having a drop resistor, may be connected in parallel with the speed up capacitor.

The driver hereinabove described may be used in combination with a source with DC voltage to construct a DC to AC inverter. In such a situation a first solid switch using the driver of present invention would be operated with a second solid state switch having a similar driver, out of phase from one another. Means also would be provided for shaping the output of the first and second solid state switches into a sinosoidal AC signal. The shaping means may include a first and second inductance capacitance circuits. To further protect the out of phase operation of the two switches, means may be provided for generating a blanking signal during a selected time period between a time period commencing with the turn-off of one switch and the turn on of the other switch. A two switch combination would produce a half bridge inverter which would be applicable to low power equipment.

A full bridge inverter may be obtained by combining two pairs of switches, each pair firing simultaneously and out of phase from second pair of switches. Likewise, a three phase inverter may be obtained by combining three pairs of switches, each pair acting simultaneously and 120° out of phase from another pair of switches. Again, means may be provided to blank the switch activation to avoid one pair of switches being turned on at the same time as any other pair of switches.

The present application also presents a protection system for preventing the simultaneous firing of first and second solid state switches connected in a push-pull configuration. In other words, first and second switches are normally alternately turned on. In case of component failure, a diode rectifier is electrically connected to the collector of the first solid state switch and a capacitor is connected to the base of the second solid state switch and to the diode. The capacitor and diode are connected such that the positive side of the capacitor is grounded producing a negative voltage at the base of the second switch when the first switch is "ON". Thus, the second switch is prevented from firing in any case. Anti-cross over diode may be combined with a second diode capacitor combination to prevent the firing of the first switch when the second switch is turned on. It may be apparent that this protection system is also applicable to the half bridge, full bridge, push-pull or three phase power inverters described hereinabove.

It may be apparent that a novel driver stage applicable to an inverter also possessing novelty is provided. It may also be apparent that a novel system for at least a pair of solid state switches acting in a push-pull mode is also provided.

It is an object of the present invention to provide a driver which operates in a wide band, utilizing zero to 100% pulse width modulation.

It is another object of the present invention to provide a novel inverter which is particularly useful as an emergency AC power supply in the event of utility power source failure or surge.

Another object of the present invention a driver which may be utilized in a novel inverter having half bridge, full bridge, or three phase capabilities.

It is yet another object of the present invention to provide an inverter which operates at high speed and high frequency to eliminate audio noise typical of the prior art ferroresonant type inverters.

Another object of the present invention is to provide a full duty cycle isolated transformer driver which may employ MOSFET or GTO type SCRS.

Another object of the present invention is to provide a novel driver stage which employs extremely fast turn-on and turn-off capabilities and which is also susceptible to high current drive.

Another object of the present invention is to provide a novel inverter useful as an AC power source which is completely portable and extremely compact.

Another object of the present invention is to provide an inverter using solid state switches which includes a protection system to prevent a simultaneous switching "ON" of a pair of switches or pairs of switches.

Still another object of the present invention is to provide a driver stage utilizing a step down or a step up transformer.

Another object of the present invention is to provide a driver stage which prevents or minimizes parasitic oscillation.

The invention possesses other objects and advantages especially as concerns particular characteristic and features thereof which will become apparent as the specification continues.

BRIEF DESCRIPTION OF THE DRAWINGS

FIG. 7 is a schematic diagram of a zero to 100% driver utilizing GTO, SCR switches and the like.

DETAILED DESCRIPTION OF THE PREFERRED EMBODIMENTS

Various aspects will evolve from the following detailed description which should be referenced to the hereinabove described drawings.

Figure 1:
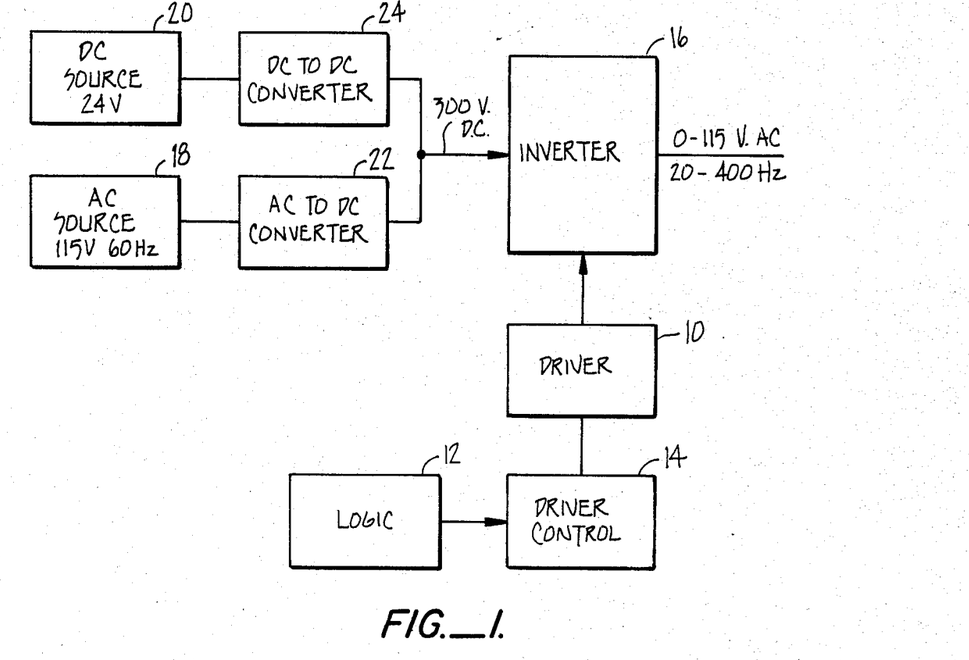
FIG. 1 is a schematic block diagram of the inverter of the present invention.

The driver stage of the present invention is noted in the drawings by reference character 10 combined with a letter to denote the various embodiments of the novel driver concept. Logic 12 feeds driver control 14 which in turn controls driver stage 10. Driver 10 may be used as a component in inverter 16 which inverts 300 V.D.C. to an AC power source having a predetermined voltage and frequency. An AC source of typically 115 V, 60 HZ, or a DC source of 24 V may be used as the input to the AC to DC converter 22 or the DC to DC converter 24. Either the AC source 18 or the DC source 20 may be employed therein. Of course, the AC source is available as the common power supply from a central generating plant. The DC source would be in the form of storage batteries which are readily available also. By using the novel driver stage 10, the inverter 16 is itself novel.

Figure 2:
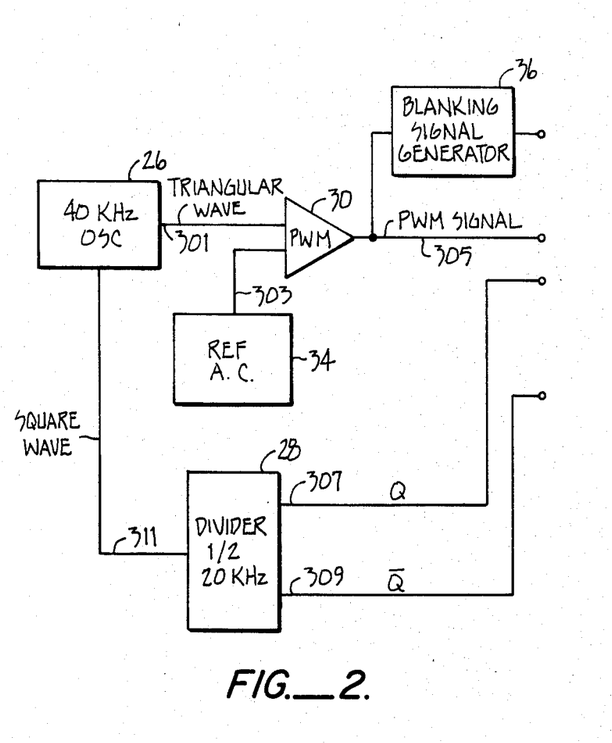
FIG. 2 is a schematic block diagram of the logic portion of the present invention.
Figure 3:
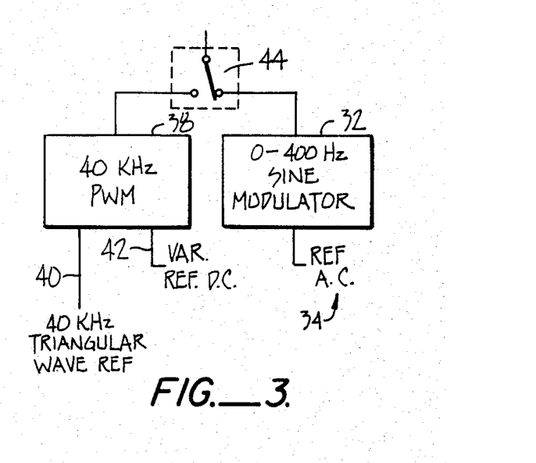
FIG. 3 is a schematic block diagram of another embodiment of the logic of the present invention.
Figure 12:
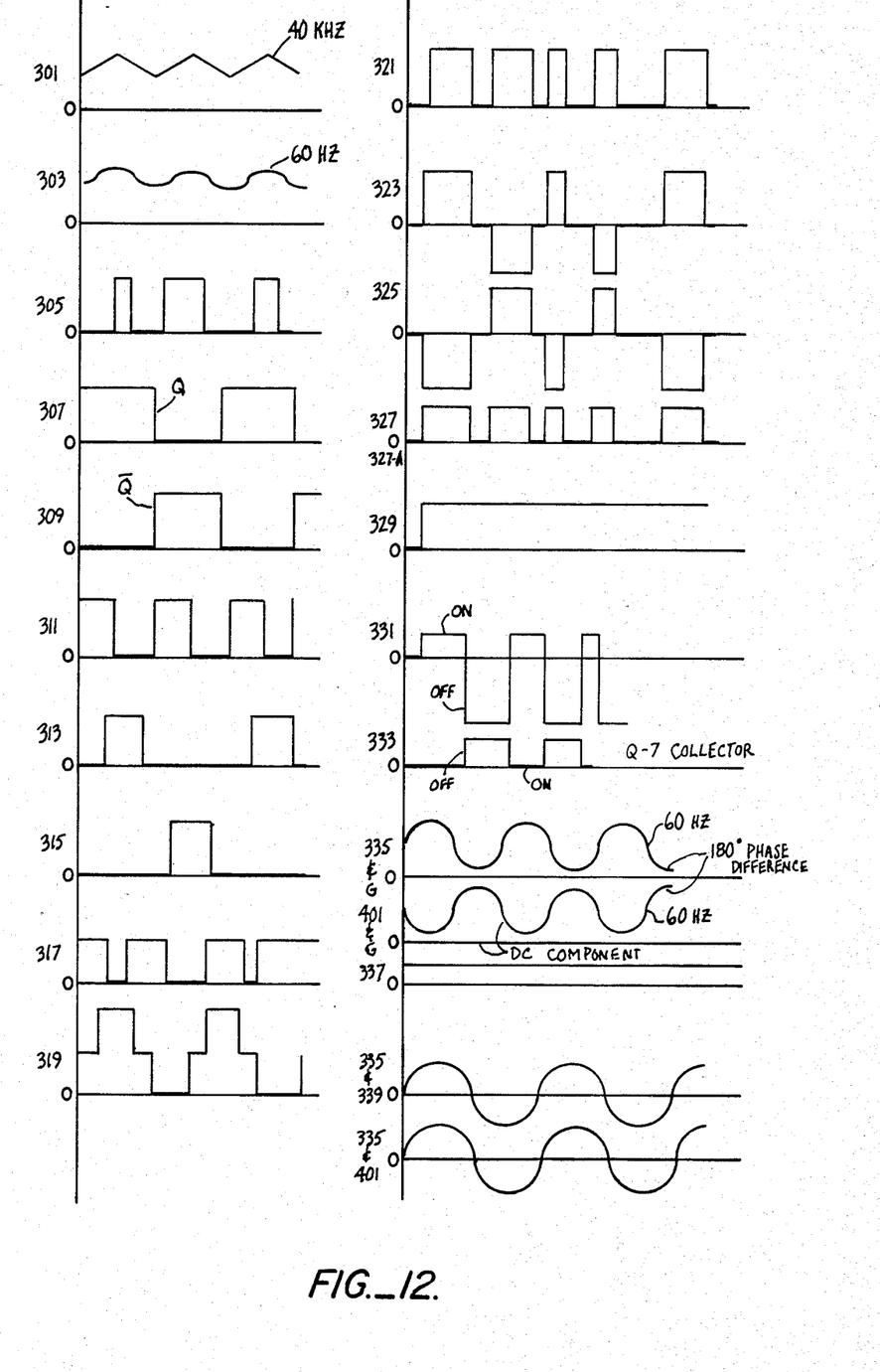
FIG. 12 is a series of graphs indicating the waves forms in various forms in the schematic diagrams for the driver and the inverter of the present invention.

With reference to FIG. 2, it may be seen that a logic schematic is shown. The remaining figures include reference numbers beginning with reference character 301 denoting the wave form of the signal at that point in the circuitry to be discussed hereinafter. FIG. 12 depicts a typical wave form, without regard to amplitude at the denoted points. A sine modulator is provided by the use of a 40 KHZ oscillator, a 20 KHZ divider, and a pulse width modulator 30. This sine modulator 32 is shown in FIG. 3. A reference audio-frequency oscillator 34 is also employed as an input to the pulse with modulator 30. With reference to FIG. 12, it may be seen that a triangular wave is generated by the 40KHZ oscillator at point 301. Likewise, a square wave is also generated by the same component at point 311 and serves as an input for the divider 28. The audio-frequency oscillator 34 produces a sine wave shown at point 303. A pulse width modulated signal at point 305 is generally a square type wave as shown. Divider 28 produces a high signal, Q, and a low signal $\bar{Q}$ at point 309. As may seen, complimentary square waves are produced. A pulse width modulated signal at point 305 is directed to the blanking signal generator 36, whose function will be described hereinafter. Thus, four inputs are generated by the logic section 12 and are fed into the driver control section 14.

With reference to FIG. 3, it may be seen that the sine modulator 32 in combination with the audio-frequency oscillator may be substituted for the 40 KHZ PWM 38 which has a 40 KHZ triangular wave reference 40, as well as a variable reference DC 42 as its inputs. Thus, a modulated DC signal would exit the modulator 38 causing a positive or a negative polarity DC output at the inverter 16 which will be discussed hereinafter. A switch 44 would determine which type of logic, AC or DC, will be used to feed the driver control 14. A failure of commercially available AC power would permit the user to feed a source of DC power, e.g. a battery DC converter, into the modulator 38. Likewise, an AC reference 34 may be generated without a commercially available source of power. It has been found that in most cases an AC reference is used as the logic.

Figure 4:
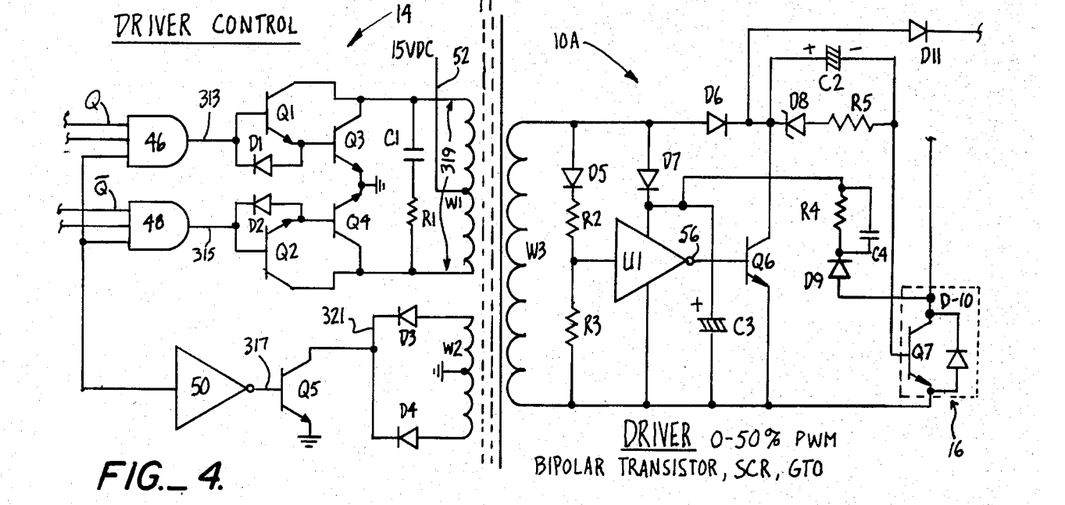
FIG. 4 is a schematic diagram of the zero to 50% driver using a GTO, SCR and like switches.

FIG. 4 shows the detailed schematic of driver control 14 as well as a zero to fifty percent pulse width modulation driver using a type BIPOLAR transistor as the switching mechanism. With reference to the driver control 14, AND gates 46 and 48 each receive the pulse width modulated signal and a blanking signal from the pulse width modulator 30, and the blanking signal generator 36 hereinbefore described. AND gate 46 also has as an input the Q, or high, signal from divider 28 while AND gate 48 receives the $\bar{Q}$, or low, signal therefrom. A signal wave form from AND gates 46 and 48 are shown on FIG. 12 at points 313 and 315. Transistors Q-1 and Q-3 are in a Darlington configuration. Diode D-1 spans the emitter and base of the N-P-N transistor Q-1. The Q-1 and Q-3 combination receives the AND gate 46 signal at point 313. Transistors Q-2 and Q-4 are also in the Darlington configuration with diode D-2 connecting the emitter and base of Q-2. It should be noted that Q-1 and Q-3 are 180° out of phase from Q-2 and Q-4. The emitters of Q-3 and Q-4 are grounded. Connected in parallel to Q-3 and Q-4 is a snubber leg comprising capacitor C-1 and resistor R-1. The signal between the snubber nodes is shown at point 319 and is fed to winding W-1 of transformer T-1. Transformer T-1 has a push-pull primary W-1 with two windings at W-2 for a full wave clamping circuit which will be discussed hereinafter. T-1 also includes secondary winding W-3 with expandable secondary windings as needed. Returning to the driver control of FIG. 4, it may be seen that an inverter 50 receives the pulse width modulated signal and produces a wave form shown on FIG. 12 at point 317. N-P-N transistor Q-5, in combination with diodes D-3 and D-4, comprise a clamping circuit to prevent oscillation in the signal feeding into transformer T-1 due to the natural resonance of the transformer T-1. In other words, the clamp circuit dampens the natural resonance of the wound transformer. Winding W-2 is grounded between diodes D-3 and D-4. A voltage source 52 is fed into winding W-1 and typically has a value of about 15 V. Transformer T-1 steps down the voltage at winding W-3 to a value of 7 V by way of example.

Figure 5:
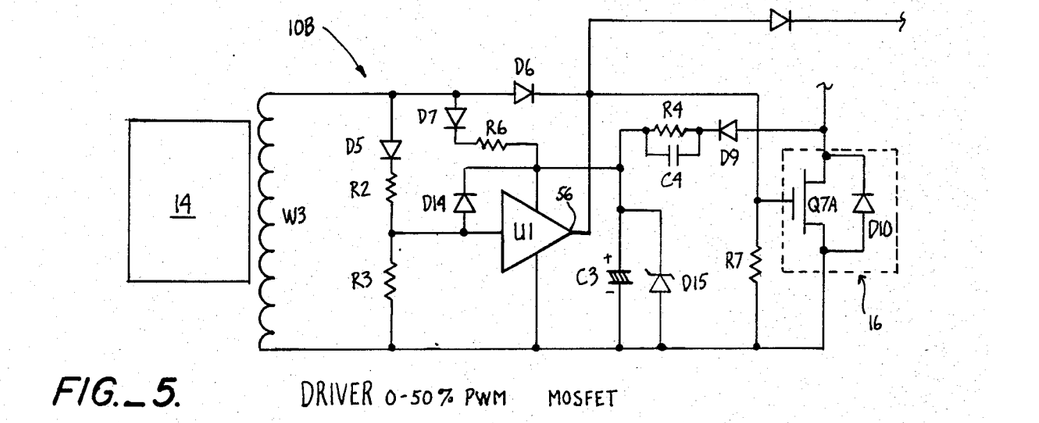
FIG. 5 is a zero to 50% driver utilizing an MOSFET switch.
Figure 6:
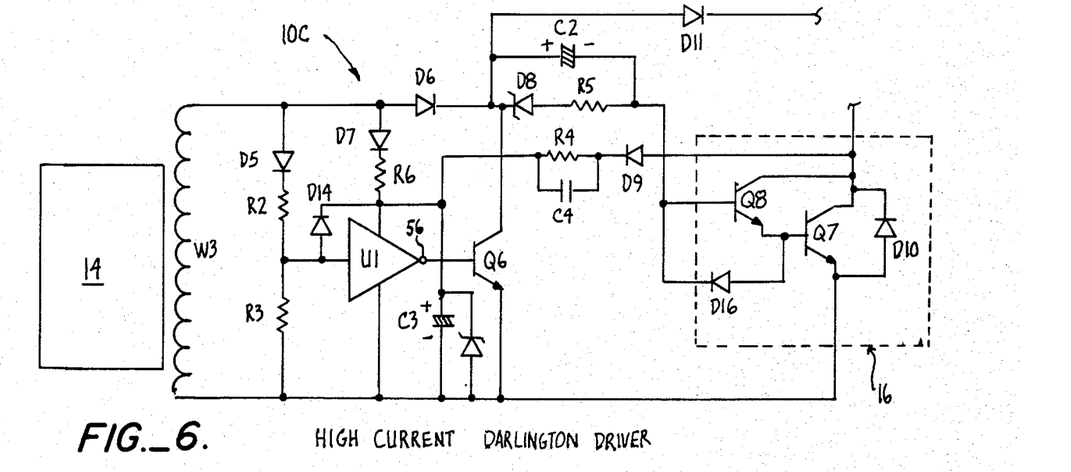
FIG. 6 is another embodiment of the driver of the present invention employing a configurated switching arrangement.

The right side of FIG. 4, and FIGS. 5 and 6, depict 0-50% pulse width modulated drivers 10A, 10B and 10C. Driver 10A, FIG. 4, is useable for a switch Q-7 which is of a bipolar transistor, SCR, GTO, type. The driver 10B, FIG. 5, utilizes a switch Q-7A which is a MOSFET. The driver of FIG. 10C utilizes a pair of N-P-N transistors Q-7 and Q-8 with diode D-16 in the Darlington configuration. As the components of the driver shown in FIGS. 4-8 include common elements, the following explanation for FIGS. 7 and 8 should suffice for describing each of the drivers shown in FIGS. 4-8. It should be noted that the switches Q-7, Q-7A, and Q-9 are shown in combination with a diode D-10 and constitute a portion of the inverter 16 which will be hereinafter described.

Figure 7:
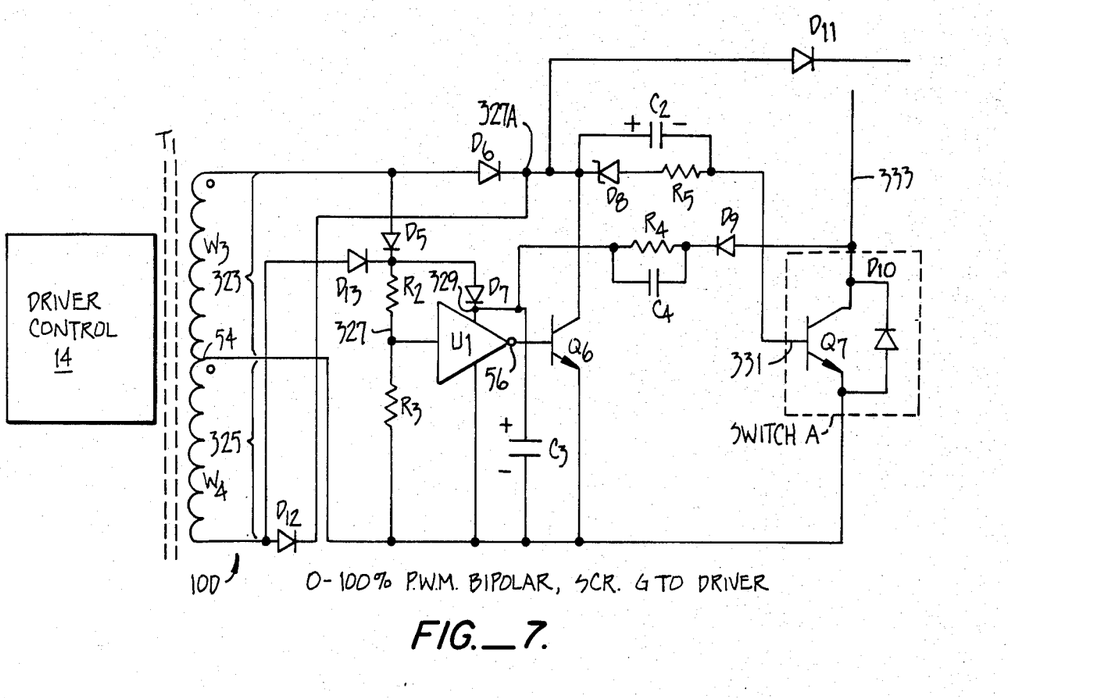

The driver in FIGS. 7 and 8 include the provision of a center tap 54 on transformer T-1, thus, the secondary windings will be described as windings W-3 and W-4. Focussing on FIG. 7, it may be seen that the wave forms across windings W-3 and W-4 are shown at points 323 and 325 on FIG. 12. The diodes D-5 and D-13 rectify the positive side of the W-3 and W-4 output. Resistors R-2 and R-3 serve as a voltage divider at node 327, the wave form of which may be found on FIG. 12. As may be seen, the wave form at points 327 and 327A comprise a pulse width modulated DC signal which is fed into a zero-crossing detector U-1 and to the Q-7 base respectively. Diode D-7 feeds a steady state DC signal into zero-crossing detector U-1 which is required by that device as a power supply. The wave form entering the U-1 zero-crossing detector may be seen at point 329, FIG. 12. Typically, the amplitude of the DC signal entering zero-crossing detector U-1 at this point is approximately 5 V. Capacitor C-3 serves to eliminate any ripple which may occur in this portion of the circuit. D-6 and D-12 will pass the positive portion of the pulse width modulated signal but block the negative of the signal when it arrives. Thus, the positive or peak of the pulse width modulated signal will travel to the base of switch Q-7 to turn it on. The peak of the pulse width modulated signal traveling to zero-crossing detector U-1 will produce a zero output at node 56 which will keep clamp transistor Q-6 in a deactivated state. Diode D-12 would provide the high or peak value to Q-7 from winding W-4, and in analogous fashion, diode D-6 from winding W-3.

To initiate the turn-off of switch Q-7, zero-crossing detector U-1 receives a zero signal from the valley of the pulse width modulated signal at point 327. This initiates a high output at node 56 which activates clamp transistor Q-6. Thus, the collector of Q-6 turns on and the positive side of capacitor C-2 is grounded. Also, the negative voltage from the negative side of capacitor C-2 shuts off the base of Q-7. As shown in FIG. 7, zener diode D-8 and resistor R-5 connected in parallel with capacitor C-2 establish the voltage desired to exist on capacitor C-2. Resistor R-5 compensates zener D-8 to an accurate value. Switch Q-7 is turned off and on very rapidly in the order of fifty nano-seconds (MOSFET) to (1) micro second (BIPOLAR). This, of course, greatly reduces the power loss in the switching function. The combination of capacitor C-4 in parallel with resistor R-4, which is turn are connected in series with diode D-9, provide a snubber function to enhance the DC power to zero-crossing detector U-1. This is particularly accute when the pulse width modulation is at a low percentage, typically less than 5%. It may be said that the C-4, R-4, D-9 leg reinforces the pulse width at low modulation. The result is that a chopped DC signal exits switch Q-7 at point 333, FIG. 12. The amplitude of the chopped DC will be determined by the voltage across switch Q-7 in the inverter section, which will be described hereinafter. In the example shown in the drawings, this voltage would be 300 V DC.

Figure 8:
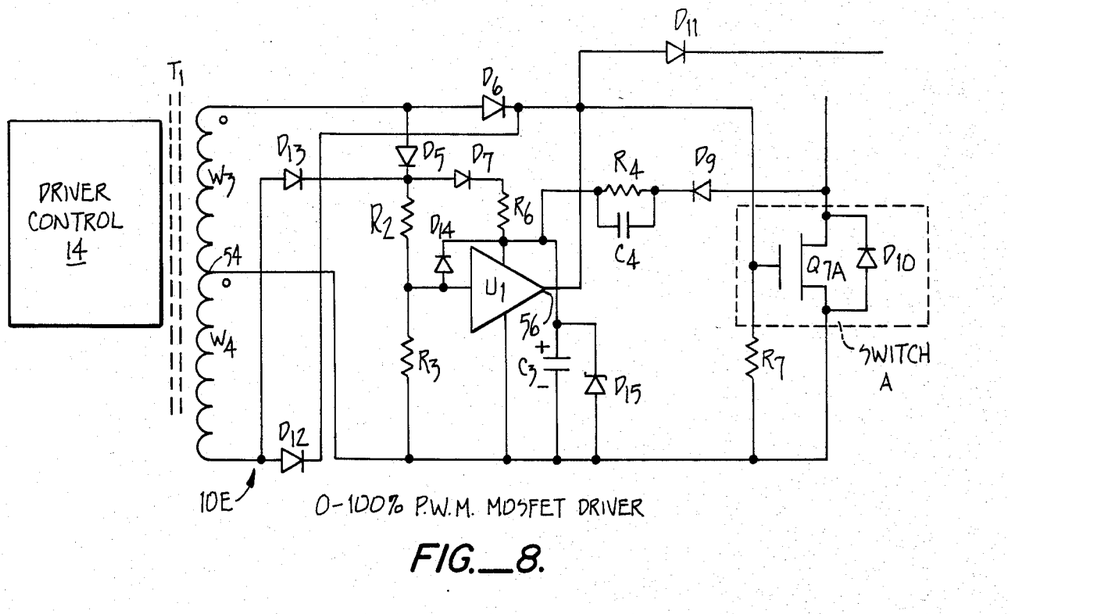
FIG. 8 is a zero to 100% MOSFET driver.
Figure 9:
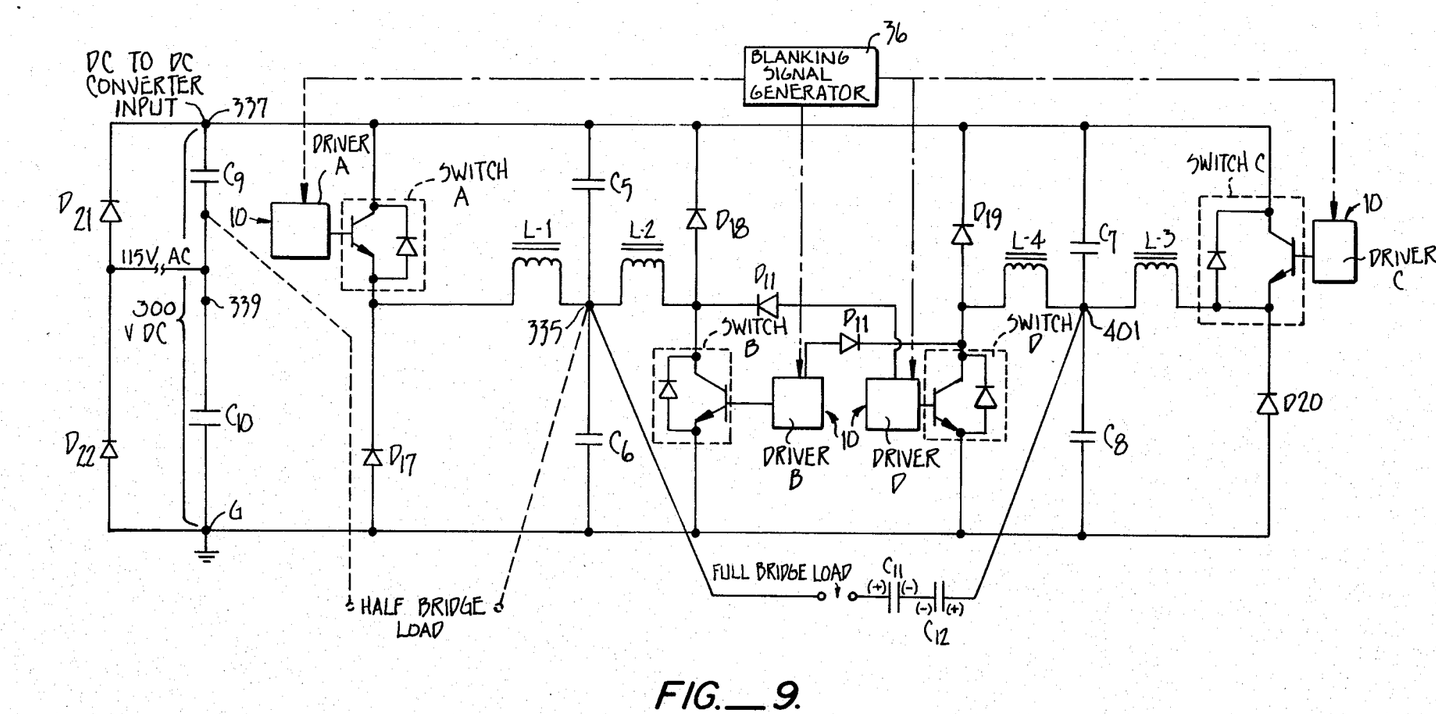
FIG. 9 is a schematic diagram of a full bridge inverter utilizing the driver of the present invention.

Referring to FIG. 8, it may be apparent that a MOSFET switch Q-7A may be used in place of the BIPOLAR type switch Q-7. Since the MOSFET possesses a high impedance input, low current is required which eliminates the need for the Q-6 clamp. Thus, a zener diode D-15 is placed parallel with capacitor C-3. A shunt resistor R-7 bleeds the gate of the MOSFET Q-7A to ground. Diode D-14 and resistor R-6 enhance the protection of detector U-1, since the MOSFET operates at a higher voltage. A peak or high signal into the zero-crossing detector U-1 will produce a high output at node 56 and vice-versa for a low signal input. Thus, a high signal would activate the MOSFET while a low signal directly grounds out the gate of the MOSFET from the output of the zero-crossing detector U-1. Returning to FIGS. 4, 5 and 6, it should be mentioned that the halfway 0-50% pulse width modulation drivers do not require the use of diodes D-12 and D-13 and winding W-4 of transformer T-1. Diode D-11 serves as a portion of a protection system to prevent the simultaneous activation of multiple switches when driver 10 is used in an inverter. With reference to FIG. 9, it may be said that the driver 10 of the present invention may be combined with other drivers as components of half bridge or full bridge inverters. With reference to FIG. 9, it may be seen that driver A and switch A, comparable to drivers 10D and 10E and switches Q-7 and Q-7A of FIGS. 7 and 8 respectively, are shown. Similarly, drivers B, C and D, and switches B, C and D may also be employed having the same configuration as driver A and switch A. The input to inverter may be found as a 300 V DC source between point 337 and ground, FIG.

Figure 11:
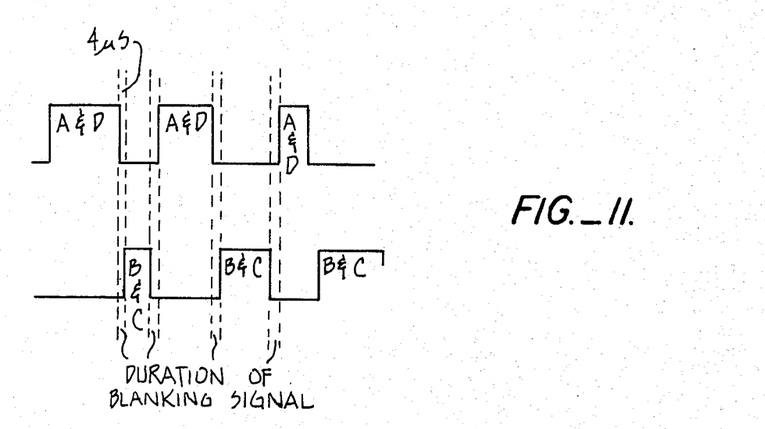
FIG. 11 is a graph indicating the timing of a blanking signal in conjunction with four solid state switches used in the inverter of the present invention.

12. Such a DC source may come from a DC to DC converter (not shown), of conventional construction which would input between point 337 and ground. As an alternative, an AC voltage of either 115 V or 220 V, 60 HZ frequency may also be fed into the inverter from a power plant or other type of generator. Diodes D-21 and D-22 combined with capacitors C-9 and C-10 would again produce the proper DC voltage between point 337 and ground. The switches A, B, C and D include anti parallel diodes which are also depicted in FIGS. 4-8. The emitters of the switches are shown connected to energy catching diodes D-17, D-18, D-19 and D-20. Each switch is associated with a swinging choke input filter such as L-1–C-6, L-2–C-5, L-3–C-8 and L-4–C-7. Switches A and B may comprise a half bridge inverter for devices having a light duty resistive load. In such a case, switches A and B would be fired 180° out of phase. Blanking signal generator 36 would produce a blanking signal of approximately 4 micro seconds in the case of BIPOLAR switches to prevent the switching of A and B simultaneously. A full bridge inverter would fire switches A and D simultaneously and B and C simultaneously. Again, blanking signal generator 36 would provide a blanking signal to prevent the simultaneous switching of switches A and B or C and D. With reference to FIG. 11, it may be seen that a typical timing diagram is shown creating the chopped DC signal. Where switches A, B, C or D are of the MOSFET type, the blanking signal can be shortened to 500 nano seconds. Also, the inductors L-1, L-2, L-3 and L-4, as well as the capacitors C-5, C-6, C-7 and C-8, may be sized to be smaller than those components needed with the BIPOLAR type switch. It should be noted that using modulator 38 will produce a positive or negative DC output at point 335 and 401, FIG. 9.

C-11 and C-12 are DC blocking capacitors which eliminate DC component at the load. This DC component may arise because of imbalance in the switches A, B, C and D. This is especially important if an induction motor serves as the load.

Figure 10:
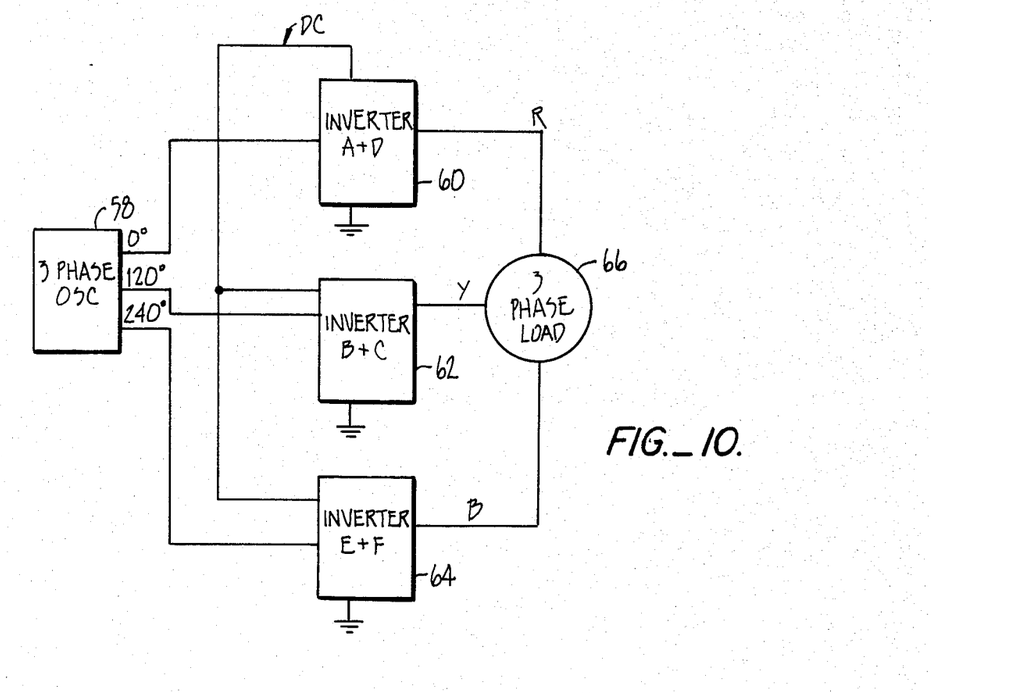
FIG. 10 is a block diagram indicating a three phase application of the inverter of the present invention.

Referring to FIG. 10, it may be shown that a three phase power inverter may be constructed utilizing a three phase oscillator 58 which feeds a three phase signal into inverters 60, 62 and 64 having pairs of switches such as the push-pull switches shown in FIG. 9. A three phase load 66 would accept the outputs from inverters 60, 62 and 64.

Figure 13:
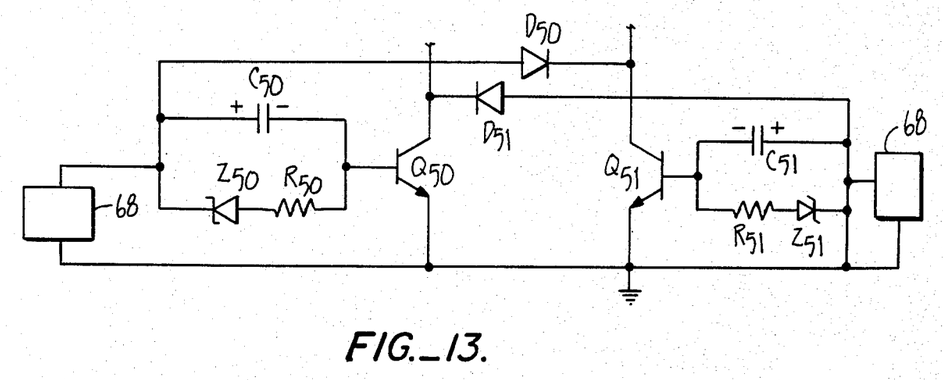
FIG. 13 is a schematic diagram showing the anti-cross over diode system for two solid state switches in a push-pull configuration.
Figure 14:
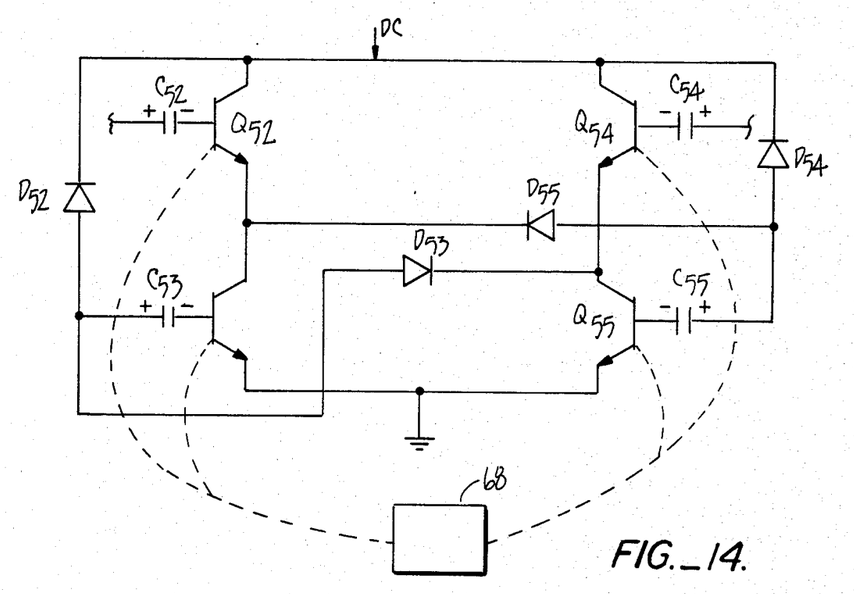
FIG. 14 is a schematic diagram showing the anti-cross over diode system for four solid state switches in full bridge configuration.

The invention of the present application is also deemed to include a diode protection system to prevent the simultaneous firing of first and second solid state switches connected in push-pull manner. In other words, a pair of switches would be connected and fired consecutively from the same source of signals. With reference to FIG. 13, it may be seen that transistors Q-50 and Q-51 having grounded emitters are normally fired consecutively from means 68 (shown schematically). If a mishap occurs in the circuitry, a signal may arrive at transistors Q-50 and Q-51 to turn them on at the same time, producing a disasterous result. Connected to the base of transistor 50 is a capacitor C-50 in parallel with zener diode Z-50 and resistor R-50. A diode D-50 is in series with that combination and connects to the collector of transistor Q-51. Similarly, capacitor C-51 is shown in parallel with zener diode Z-51 and resistor R-51. A diode D-51 connects that combination to the collector of transistor Q-50. Thus, when transistor Q-50 is turned on, it saturates. Diode D-51 is therefore grounded as well as capacitor C-51. A negative voltage must therefore appear at the base and emitter of Q-51 to prevent its turning on if a signal arrives from means 68. Vice-versa when transistor Q-51 is on, diode D-50 and capacitor C-50 are grounded such that the base of transistor Q-50 will not accept a turn on signal while transistor Q-51 is turned on. Turning to FIG. 14, it may be seen that the protection system disclosed herein may also apply to pairs of solid state switches fired alternatively to other pairs of solid state switches. For example, switches Q-53 and Q-54 would turn on at the same time while switches 52 and 55 would be off. In other words, solid state switches Q-53 and Q-54 act together and oppositely from switches Q-52 and Q-55. Means 68 for turning on pairs of switches is shown schematically. As may be seen, when switches Q-53 and Q-54 are on, normally, switches Q-52 and Q-55 are off. To insure this state of affair, diode D-55 would ground the capacitor C-55 at the base of switch Q-55 to prevent its turning on. Also, the diode D-54 cathode effectively connects to the collector of Q-55 via switch Q-54. Thus, Q-55 cannot turn on. Capacitor C-53 and diode D-53 would prevent switches Q-53 from turning on while switches Q-52 and Q-55 are on.

The following is a list of components which may be used in the circuit diagram shown in the above figures:

| COMPONENT LIST | | |
|---|---|---|
| Components | Description | Manufacturer |
| Switches | | |
| A, B, C, D, Q-7 Q-9, Q-50, Q-51, Q-52, Q-53, Q-54, Q-55 | 2N6677 | RCA |
| Q-1, Q-2, Q-5 | 2N2222A | Motorola |
| Q-3, Q-4, Q-6 | ECG293 | Sylvania |
| Q-7A | VN4000A | Siliconix |
| Diodes | | |
| D-1, D-2, D-3, D-4, D-5, D-7, D-13 | 1N4148 | Motorola |
| D-6, D-9, D-10, D-11, D-12, D-16, D-20, D-50, D-51, D-52, D-53, D-54, D-55 | MR817 | Motorola |
| D-8, D-15, Z-50, Z-51 | 3.3 V zener 1N4728 or equivalent | Motorola |
| D-17, D-18, D-19 D-20 | MR824 or fast recovery equivalent | Motorola |
| Capacitors | | |
| C-1–C-4 | .005 100 V disc | Sprague |
| C-2, C-50, C-51, C-53, C-54, C-55 | 3.9 MF tantalum 35 V | Sprague |
| C-3 | 100 MF 10 V electrolytic | Sprague |
| C-5, C-6, C-7, C-8 | 4 MF 200 V High Frequency | Sprague |
| C-9, C-10 | 470 MF 200 V electrolytic | Sprague |
| C-11, C-12 | 1000 MF 63 V | Sprague |
| Resistors | | |
| R-1 | 510 ⅛ W 5% | Digi-Key |
| R-2, R-6 | 33 OHM, ¼ W, 5% | Digi-Key |
| R-3 | 330 OHM, ¼ W, 5% | Digi-Key |
| R-4 | 24K OHM, 2 W, 10% | Digi-Key |
| R-5, R-7, R-50, R-51 | 0.5–4 OHM, 1 W, 5% | Digi-Key |
| Inductors | | |
| L-1, L-2, L-3, L-4 | Ferrite core gapped | Stackpole |
| Misc. | | |
| U-1 | DM7404 | National |

-continued

COMPONENT LIST

| Components | Description | Manufacturer |
|---|---|---|
| T-1 | 3B7 1811 ferrite | Feroxcube |
| P.W.M. (30) | LM 339 | National |
| OSC 40 KHZ (26) | LM 555 | National |
| OSC Audio (34) | ICL 8038 | Exar |
| Divider (28) | DM 7474 | National |
| Blanking Signal Generator (36) | DM 74123 | National |

What is claimed is:

1. A driver stage comprising:
   a. means for detecting a low point in a signal;
   b. means for generating a pulse width modulated signal having a series of peaks and low points at a first voltage;
   c. means for transforming said pulse width modulated signal to a second voltage;
   d. means for rectifying said transformed signal, said rectified transformed signal serving as an input to said means for detecting a low point in a signal;
   e. a solid state switch being placed across a voltage source;
   f. a diode having an output into said solid state switch, said transformed signal serving as an input to said diode such that said peaks of said transformed rectified signal turns on said solid state switch;
   g. means for delivering a turn-off signal to said solid state switch, said means for delivering said turn-off signal being determined by the output of said means for detecting a low point in a signal relative to said low points of said transformed rectified signal input.

2. The driver of claim 1 in which said means for delivering a turn-off signal to said solid state switch includes a clamp transistor the base of which is connected to the output of said zero-crossing detector, the emitter of which is connected to ground, and the collector of which is connected to means for providing a negative voltage to said solid state switch, such that the low point of said transformed rectified signal activates said means for detecting a low point in a signal output signal which grounds the emitter of said clamp transistor and triggers said means for providing a negative voltage to said solid state switch.

3. The driver of claim 2 in which said means for providing a negative voltage to said solid state switch comprises connecting the output of said diode to said collector of said clamp transistor and a speed-up capacitor, the positive side of which is connected to said collector of said clamp transistor and the negative side of which is connected to said solid state switch.

4. The driver of claim 3 in which said means for providing a negative voltage further comprises a zener diode connected in parallel with said speed-up capacitor.

5. A DC to AC inverter having in combination a source of DC voltage the improvement comprising:
   a. a first solid state switch being placed across said source of DC voltage;
   b. first driver means for activating said first solid state switch, said driver means comprising:
      (1) means for detecting a low point in a signal;
      (2) means for generating a pulse width modulated signal having a series of peaks and low points at a first voltage;
      (3) means for transforming said pulse width modulated signal, said rectified transformed signal serving as an input to said means for detecting a low point in a signal;
      (4) a diode having an ouput into said solid state switch, said transformed rectified signal serving as an input to said diode such that said peaks of said transformed rectified signal turns on said solid state switch;
      (5) means for delivering a turn-off signal to said solid state switch, said means for delivering said turn-off signal being determined by the output of said means for detecting a low point in a signal relative to said low points of said transformed rectified signal input.
   c. a second solid state switch being placed across said source of DC voltage;
   d. second driver means for activating said second switch;
   e. means for operating said first and second switches out of phase from one another;
   f. means for shaping the output of said first and second solid state switches into an AC signal;

6. The inverter of claim 5 in which said means for shaping the output of said first and second solid state switch includes a first and second inductance-capacitance circuits.

7. The inverter of claim 6 which additionally comprises means for generating a blanking signal and delivering said blanking signal to said first and second switches to prevent the concurrent operation of said first and second switches.

8. The inverter of claim 5 which additionally comprises:
   a. third solid state switch;
   b. third driver means for actuating said third switch;
   c. fourth driver means for actuating said solid state switch;
   d. fourth solid state state switch;
   e. means for switching said first and fourth switches together and said second and third switches together, said first and fourth switches operating out of phase from said second and third switches;
   f. means for shaping the outputs of said first second third and fourth switches into an AC signal.

9. the inverter of claim 8 in which said means for shaping the output of said first, second, third and fourth solid state switches includes first, second, third and fourth inductance capicitance circuits respectively.

10. The inverter of claim 9 which additionally comprises means for generating a blanking signal delivered to said first, second, third and fourth switches to prevent the concurrent operation of said cooperating first and fourth switches and said cooperating second and third switches.

11. The invertor of claim 8 in which said means for generating a pulse width modulated signal additionally includes means for producing a three phase pulse width modulated signal and which further comprises fifth and sixth solid state switches and fifth and sixth driver means for actuating said fifth and sixth solid state switches respectively, means for switching said fifth and sixth solid state switches together and out of phase from said phased first and fourth solid state switches and said phased second and third solid state switches, and means for shaping the outputs of said first, second, third, fourth, fifth and sixth switches into an AC signal.

12. The driver stage of claim 1 in which said means for detecting a low point in a signal comprises a zero-crossing detector.

13. The inverter of claim 5 in which said means for detecting a low point in a signal comprises a zero-crossing detector.

* * * * *